United States Patent
Kim et al.

(10) Patent No.: US 9,819,133 B2
(45) Date of Patent: Nov. 14, 2017

(54) HOT STAMPING WIRING, ELECTRIC DEVICE HAVING THE SAME, AND METHOD FOR MANUFACTURING THE SAME

(71) Applicant: Samsung Electronics Co., Ltd., Suwon-si, Gyeonggi-do (KR)

(72) Inventors: Sung-il Kim, Yongin-si (KR); Si-ho Jang, Seongnam-si (KR)

(73) Assignee: SAMSUNG ELECTRONICS CO., LTD., Suwon-Si (KR)

(*) Notice: Subject to any disclaimer, the term of this patent is extended or adjusted under 35 U.S.C. 154(b) by 0 days.

(21) Appl. No.: 15/258,240

(22) Filed: Sep. 7, 2016

(65) Prior Publication Data
US 2017/0125961 A1    May 4, 2017

(51) Int. Cl.
H01R 43/02 (2006.01)
H05K 1/00 (2006.01)
H05K 5/00 (2006.01)
H01R 12/70 (2011.01)
H01B 1/00 (2006.01)
H01R 12/59 (2011.01)

(52) U.S. Cl.
CPC ........ H01R 43/0207 (2013.01); H01B 1/00 (2013.01); H01R 12/7041 (2013.01); H05K 1/00 (2013.01); H05K 5/0017 (2013.01); H05K 5/0069 (2013.01); *H01R 12/592* (2013.01)

(58) Field of Classification Search
CPC ........... H01R 43/0207; H01R 12/7041; H01R 12/592; H05K 1/10; H05K 5/0069; H05K 5/0017
See application file for complete search history.

(56) References Cited

U.S. PATENT DOCUMENTS

| 6,426,241 B1 | 7/2002 | Cordes et al. |
| 2008/0122705 A1 | 5/2008 | Kurashima et al. |

FOREIGN PATENT DOCUMENTS

| JP | 2002-289412 | 10/2002 |
| KR | 10-1998-086323 | 12/1998 |
| KR | 10-2001-0060304 | 7/2001 |
| KR | 10-2006-0065837 | 6/2006 |
| KR | 10-0748575 | 8/2007 |
| KR | 10-2008-0041002 | 5/2008 |
| KR | 10-0907266 | 7/2009 |
| KR | 10-2010-0043945 | 4/2010 |
| KR | 10-1511685 | 4/2015 |
| KR | 10-1523177 | 5/2015 |

*Primary Examiner* — Jeremy C Norris
(74) *Attorney, Agent, or Firm* — Staas & Halsey LLP

(57) ABSTRACT

A hot stamping wiring includes a hot stamping film that has insulation properties and can be attached to an insulating part by a hot stamping method, an electronic device having a hot stamping and a hot stamping method are provided. The hot stamping wiring includes a plurality of band-shaped conductors that are formed in a band shape of a material having electrical conductivity, attachable to a surface of the hot stamping film in a lengthwise direction of the hot stamping film, and are spaced apart at intervals, and a connector wafer, which includes a plurality of connecting pins corresponding to the plurality of band-shaped conductors, is disposed at the hot stamping film, and is attached to the insulating part by ultrasonic welding, wherein the connector wafer comprises a plurality of junction projections for ultrasonic welding.

20 Claims, 16 Drawing Sheets

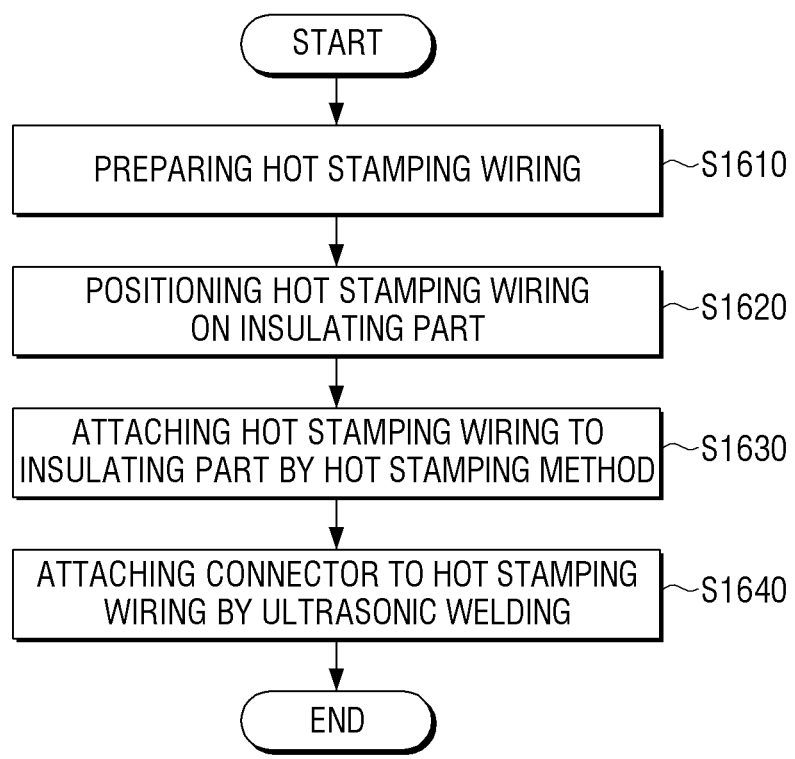

HOT STAMPING WIRING, ELECTRIC DEVICE HAVING THE SAME, AND METHOD FOR MANUFACTURING THE SAME

CROSS-REFERENCE TO RELATED APPLICATIONS

This application claims priority benefit from Korean Patent Application No. 10-2015-0154719 filed Nov. 4, 2015 in the Korean Intellectual Property Office, the disclosure of which is incorporated herein by reference in its entirety.

BACKGROUND

1. Field

The present disclosure relates to wiring connecting electronic components disposed in an electronic device. More particularly, the present disclosure relates to a hot stamping wiring which is disposed on an inner component of an electronic device by using a hot stamping method and connects electronic components, an electronic device having the same, and a method for manufacturing the same.

2. Description of the Related Art

Generally, electronic devices such as home appliances includes at least one load, such as a motor, and a controller for controlling such a load. The controller may be configured in a printed circuit board. In home appliances, in order to control the load, the load is connected to the printed circuit board using a wire harness.

The wire harness for connecting the load and the printed circuit board is composed of a plurality of connectors and wires that are freely deformed and an outer shape of which is not uniform. Also, after connecting the wire harness, the wire harness needs to be fixed to the inside of the electronic device not to be moved. Accordingly, when assembling the electronic device, assembly of such a wire harness is not automatically performed but manually.

For example, in a process of producing air conditioners, the wire harness is connected manually by workers in operations of connecting a control box, connecting a drain pump, connecting of sensors, and connecting a motor.

Accordingly, in order to remove the connection process of the wire harness that is difficult to be automated, a development of a wiring structure capable of automation has been required.

SUMMARY

The present disclosure has been developed in order to overcome the above drawbacks and other problems associated with the conventional arrangement. An aspect of the present disclosure is related to a hot stamping wiring which can be automated, an electronic device having the same, and a method for manufacturing the same.

According to an aspect of present disclosure, a hot stamping wiring may include a hot stamping film that has insulation properties and can be attached to an insulating part by a hot stamping method, a plurality of band-shaped conductors that are formed in a band shape, are formed of a material having electrical conductivity, are attached to a surface of the hot stamping film in a lengthwise direction of the hot stamping film, and are spaced apart at intervals, and a connector wafer that includes a plurality of connecting pins corresponding to the plurality of band-shaped conductors, is disposed at the hot stamping film, and is attached to the insulating part by ultrasonic welding, wherein the connector wafer comprises a plurality of junction projections for ultrasonic welding.

An end portion of each of the plurality of connecting pins may be formed in a contacting surface that is exposed on a surface of the connector wafer.

The plurality of junction projections may be formed between contacting surfaces of the plurality of connecting pins.

The plurality of junction projections project further than the contacting surfaces of the plurality of connecting pins.

The plurality of band-shaped conductors and the contacting surfaces of the plurality of connecting pins may be in surface-to-surface contact with each other.

An insulation sheet to cover the plurality of band-shaped conductors may be attached to at least one portion of the hot stamping film.

The hot stamping wiring may include a connector wafer for heat fusion that comprises a plurality of connecting pins corresponding to the plurality of band-shaped conductors and is attached to the portion of the hot stamping wiring, to which the insulation sheet is attached, by heat fusion, wherein the connector wafer for heat fusion comprises a plurality of junction projections for heat fusion.

The plurality of connecting pins and the plurality of band-shaped conductors may be in surface-to-surface contact with each other.

The hot stamping film may be formed of a flexible material.

The insulating part and the connector wafer may be formed of a same material.

The insulating part may include an inner component that is disposed in an inside of an electronic device or an inner surface of a clothes.

According to another aspect of the present disclosure, an electronic device having a hot stamping wiring may include a case comprising an inner component with insulation properties, at least one load disposed inside the case; at least one printed circuit board that is disposed inside the case and is configured to control the at least one load, and a hot stamping wiring to connect the at least one load and the at least one printed circuit board. The hot stamping wiring may include a hot stamping film that has insulation properties and can be attached to the inner component having insulation properties by a hot stamping method, a plurality of band-shaped conductors that are formed in a band shape, are formed of a material having electrical conductivity, are attached to a surface of the hot stamping film in a lengthwise direction of the hot stamping film, and are spaced apart at intervals, and first and second connector wafers that comprise a plurality of connecting pins corresponding to the plurality of band-shaped conductors, are disposed at two portions of the hot stamping film, and are attached to the inner component by ultrasonic welding, wherein the first and second connector wafers comprise a plurality of junction projections for ultrasonic welding, the at least one load is coupled to the first connector wafer, and the at least one printed circuit board is coupled to the second connector wafer.

The inner component with the insulation properties may include a first inner component and a second inner component that are formed separately, the first connector wafer may be disposed in the first inner component, the second connector wafer is disposed in the second inner component, the hot stamping wiring may connect the first inner component and the second inner component, and an insulation sheet to cover the plurality of band-shaped conductors may be attached to a portion of the hot stamping wiring which is not attached to the first inner component and the second inner component.

An end portion of each of the plurality of connecting pins may be formed in a contacting surface that is exposed on a surface of each of the first and second connector wafers, and the plurality of junction projections may be formed between contacting surfaces of the plurality of connecting pins.

The plurality of band-shaped conductors and the contacting surfaces of the plurality of connecting pins may be in surface-to-surface contact with each other.

The plurality of junction projections may project further than the contacting surfaces of the plurality of connecting pins.

According to another aspect of the present disclosure, a method for manufacturing a hot stamping wiring may include preparing a hot stamping wiring; positioning the hot stamping wiring on a surface of an insulating part; attaching the hot stamping wiring to the insulating part by a hot stamping method; and attaching at least one connector wafer to the hot stamping wiring by ultrasonic welding.

The hot stamping wiring may include a hot stamping film that has insulation properties and can be attached to the insulating part by the hot stamping method; and a plurality of band-shaped conductors that are formed in a band shape, are formed of a material having electrical conductivity, are attached to a surface of the hot stamping film in a lengthwise direction of the hot stamping film, and are spaced apart at intervals, wherein the connector wafer comprises a plurality of junction projections for ultrasonic welding.

The method may include removing a portion of the hot stamping film in order to attach the at least one connector wafer.

Other objects, advantages and salient features of the present disclosure will become apparent from the following detailed description, which, taken in conjunction with the annexed drawings, discloses preferred embodiments.

BRIEF DESCRIPTION OF THE DRAWINGS

These and/or other aspects and advantages of the present disclosure will become apparent and more readily appreciated from the following description of the embodiments, taken in conjunction with the accompanying drawings.

FIG. 16 is a flowchart illustrating a method for manufacturing a hot stamping wiring according to an embodiment of the present disclosure.

Throughout the drawings, like reference numerals will be understood to refer to like parts, components and structures.

DETAILED DESCRIPTION

Figure 1:
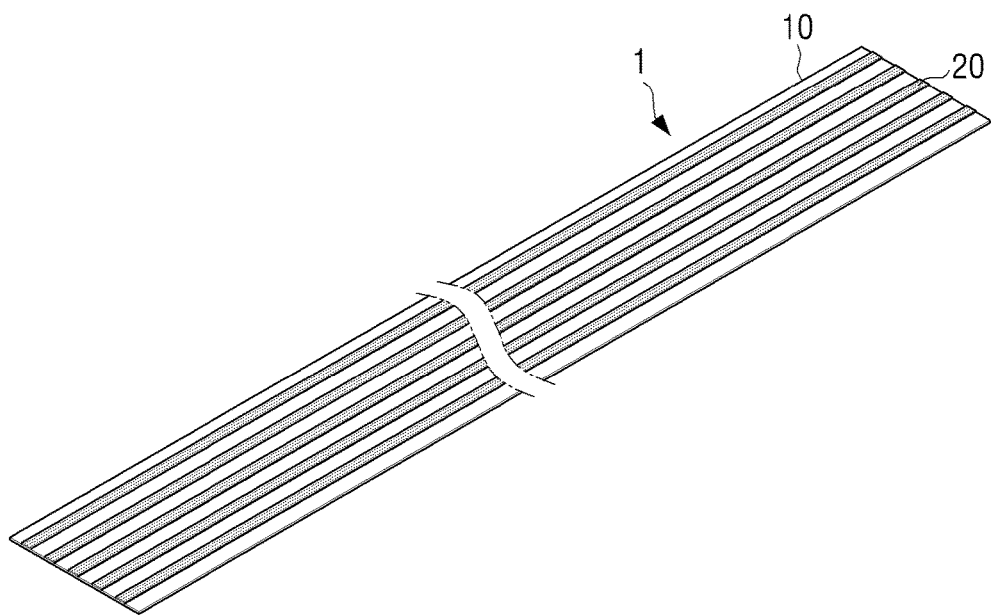
FIG. 1 is a perspective view illustrating a hot stamping wiring according to an embodiment of the present disclosure.

Reference will now be made in detail to the embodiments, examples of which are illustrated in the accompanying drawings, wherein like reference numerals refer to the like elements throughout. The embodiments are described below to explain the present invention by referring to the figures.

The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

The terms "first", "second", etc. may be used to describe diverse components, but the components are not limited by the terms. The terms are only used to distinguish one component from the others.

The terms used in the present application are used to describe the exemplary embodiments, but are not intended to limit the scope of the disclosure. The singular expression also includes the plural meaning as long as it does not differently mean in the context. In the present application, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

Figure 2:
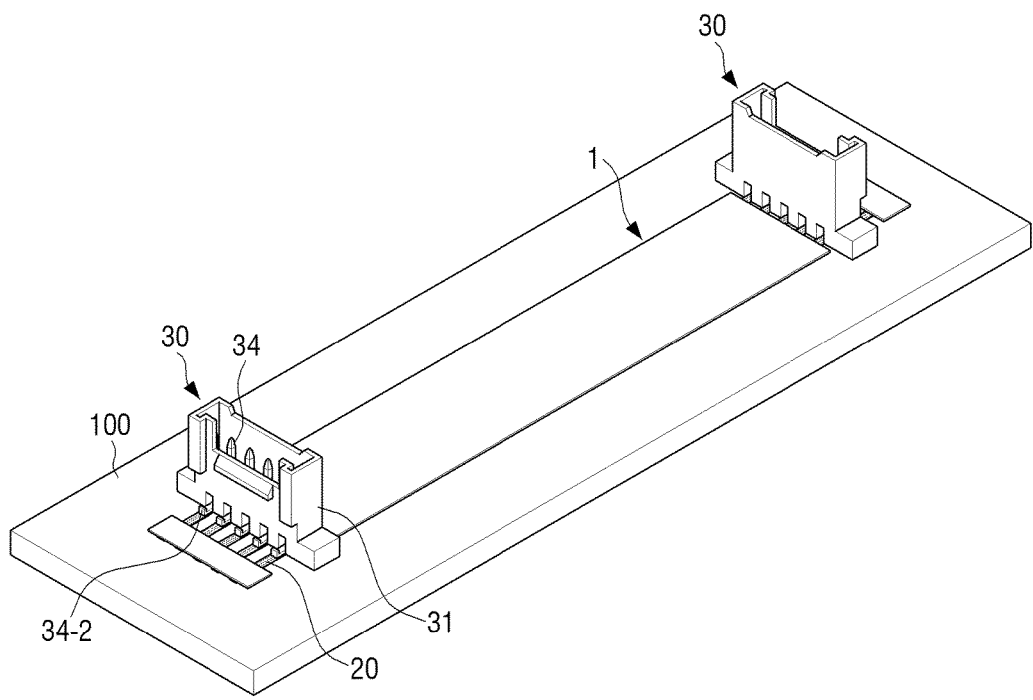
FIG. 2 is a perspective view illustrating a hot stamping wiring according to an embodiment of the present disclosure disposed on an insulating part.

FIG. 1 is a perspective view illustrating a hot stamping wiring according to an embodiment of the present disclosure. FIG. 2 is a perspective view illustrating a hot stamping wiring according to an embodiment of the present disclosure disposed on an insulating part.

Referring to FIGS. 1 and 2, a hot stamping wiring 1 according to an embodiment of the present disclosure may include a hot stamping film 10 and a plurality of band-shaped conductors 20.

The hot stamping film 10 has a thin film shape with insulating properties, and insulates the plurality of band-shaped conductors 20 so that the plurality of band-shaped conductors 20 are not shorted. The hot stamping film 10 may carry the plurality of band-shaped conductors 20, for example, in a case of automation. The hot stamping film 10 may be formed of a material that may be attached to an insulating part with insulating properties by a hot-stamping method or process. The hot stamping film 10 may be formed of a flexible material. For example, the hot stamping film 10 may be formed of polyethylene phthalate (PET) to have a thickness of about 3-15 μm.

Each of the plurality of band-shaped conductors 20 may be formed of a material having a conductivity in a thin band shape. The plurality of band-shaped conductors 20 may be attached in a longitudinal direction to a surface of the hot stamping film 10, and may be spaced apart at intervals. For example, the band-shaped conductors 20 are formed of electrically conductive material such as copper, aluminum, etc. A width of the band-shaped conductor 20 may be determined according to specifications of a connector to be used, and a length of the band-shaped conductor 20 may be appropriately determined according to a distance between two loads to be connected by the hot stamping wiring 1. A thickness of the band-shaped conductor 20 may be determined according to the magnitude of current to be passed. The number of the plurality of band-shaped conductors 20 may be determined according to the number of signal lines or power lines required for connection between two parts to be connected, for example, a load and a printed circuit board.

The hot stamping wiring 1 may be attached to a surface of the insulating part 100 by the hot stamping method or process. The hot stamping method applies adhesive on a surface of the hot stamping film 10 on which the plurality of band-shaped conductors 20 are exposed to position the hot stamping film 10 on a surface of the insulating part 100, and to apply predetermined heat and pressure to the upper surface of the hot stamping wiring 1 so that the adhesive coated on the surface of the hot stamping film 10 is melted so as to fix the hot stamping film 10 and the plurality of band-shaped conductors 20 to the insulating part 100. A pressure roller may be used to apply predetermined pressure and heat to the hot stamping wiring 1. For example, conditions of the hot stamping method may be determined as the temperature of about 150~170☐, the pressure of about 1.5~3 kg/mm$^2$, and the moving speed of the pressure roller of about 0.3~0.7 m/sec.

When an adhesive is not applied to the hot stamping film 10, but applied only to the plurality of band-shaped conductors 20, the plurality of band-shaped conductors 20 may be attached onto the insulating part 100 by the hot stamping method, and the hot stamping film 10 may be removed from the plurality of band-shaped conductors 20. If the hot stamping film 10 is removed, there may be a need to insulate the exposed band-shaped conductors 20 using a separate insulating member.

The connector is provided to connect the hot stamping wiring 1 and another component, and may include a connector wafer 30 and a connector housing. For example, the connector wafer 30 may be disposed in the hot stamping wiring 1 provided on the insulating part 100. The connector housing may be provided in a load, a flexible cable, etc.

Accordingly, when the connector wafer 30 provided in the insulating part 100 is connected to the connector housing provided in the load or the printed circuit board, the load and the printed circuit board may be electrically connected to each other through the hot stamping wiring 1.

The connector wafer 30 may be attached to the insulating part 100 in contact with the hot stamping wiring 1 through the ultrasonic welding. Alternatively, a connector wafer 90 (see, for example, FIG. 11) may be bonded or attached to the hot stamping wiring 1 by heat fusion.

Hereinafter, a connector that can be used in the hot stamping wiring 1 according to an embodiment of the present disclosure will be described with reference to FIGS. 3 to 5.

Figure 3:
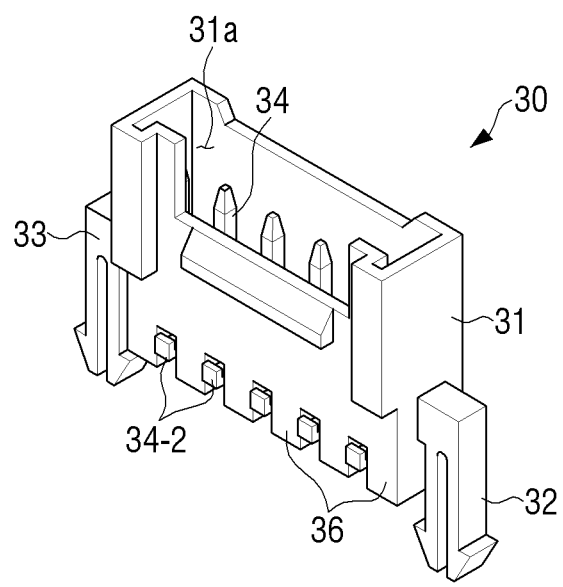
FIG. 3 is a perspective view illustrating a connector that can be used in a hot stamping wiring according to an embodiment of the present disclosure.

FIG. 3 is a perspective view illustrating a connector that can be used in a hot stamping wiring according to an embodiment of the present disclosure. FIG. 4 is a perspective view illustrating a connecting pin of the connector of FIG. 3. FIG. 5 is a rear perspective view illustrating the connector of FIG. 3.

The connector wafer 30 includes a body 31 and a plurality of connecting pins 34. The body 31 forms an appearance of the connector wafer 30, and has a plurality of through holes in which the plurality of connecting pins 34 may be disposed. A space 31a into which the connector housing may be inserted may be provided in an upper side of the body 31. Upper portions 34-1 of the plurality of connecting pins 34 may protrude into the space 31a.

Contacting surfaces 34-2 of lower portions of the plurality of connecting pins 34 may be exposed on a bottom surface of the body 31. The bottom surface of the body 31 maybe provided with a plurality of junction projections 36 that are formed between the pluralities of contacting surfaces 34-2. The plurality of junction projections 36 may be formed to protrude higher than the contacting surfaces 34-2 of the lower portions of the connecting pins 34 that is exposed on the bottom surface of the body 31. The plurality of junction projections 36 may be melted during ultrasonic welding, thereby causing the connector wafer 30 to be fixed to the insulating part 100. If the body 31 is formed of the same material as that of the insulating part 100, when the connector wafer 30 is attached to the insulating part 100, bonding strength of the connector wafer 30 may be improved.

The both sides of the body 31 may be provided with two fixing protrusions 32 and 33. The two fixing protrusions 32 and 33 may be formed to protrude further than the bottom surface of the body 31, and to be inserted into two fixing holes provided in the insulating part 100. Two corresponding fixing protrusions 32 and 33 and fixing holes may be formed to have a different diameter, thereby preventing the connector wafer 30 from being inserted incorrectly.

The upper portion 34-1 of the connecting pin 34 maybe formed in a shape that can be coupled with common connector housings, and the lower portion of the connecting pin 34 is formed to be in surface contact with the band-shaped conductor 20. One example of the connecting pin 34 is illustrated in FIG. 4. As illustrated in FIG. 4, the lower portion of the connecting pin 34 is formed in a contacting surface 34-2 that is in surface contact with the band-shaped conductor 20. The contacting surface 34-2 is formed in a band shape in a substantially perpendicular direction with respect to the upper portion 34-1 of the connecting pin 34. The contacting surface 34-2 is connected to the upper portion 34-1 of the connecting pin 34 through a bending portion 34-3. Accordingly, the contacting surface 34-2 has a certain elasticity in a direction of the upper portion 34-1 of the connecting pin 34. The contacting surfaces 34-2 are exposed between the pluralities of junction projections 36 of the bottom surface of the body 31.

In the above description, the connector wafer 30 includes the two fixing protrusions 32 and 33 for preventing erroneous insertion; however, the connector wafer 30 may not be provided with the fixing protrusions 32 and 33.

Figure 6:
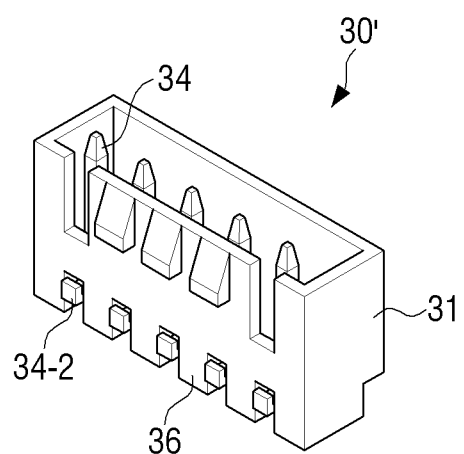
FIG. 6 is a perspective view illustrating another connector that can be used in a hot stamping wiring according to an embodiment of the present disclosure.

A connector wafer without fixing protrusions is illustrated for example, in FIG. 6.

Figure 4:
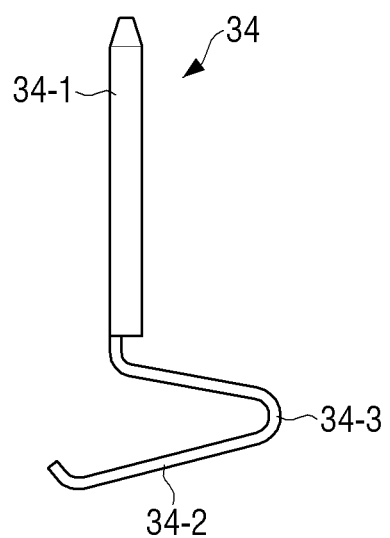
FIG. 4 is a perspective view illustrating a connection pin of the connector of FIG. 3.
Figure 5:
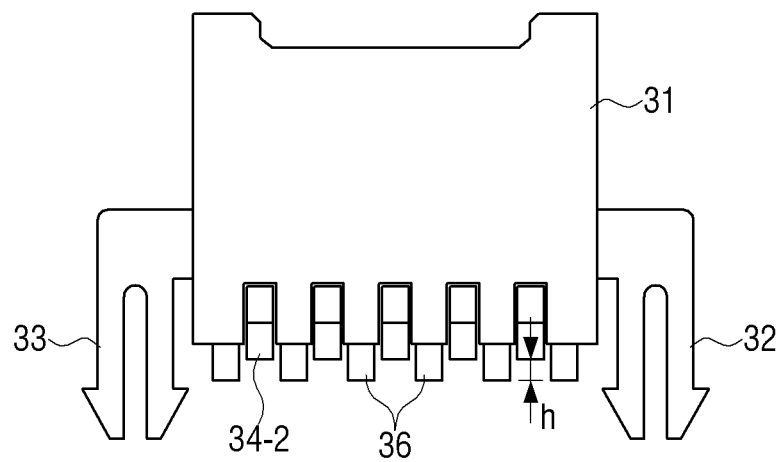
FIG. 5 is a rear perspective view illustrating the connector of FIG. 3.

The connector wafer 30' illustrated in FIG. 6 includes a body 31, a plurality of connecting pins 34, and a plurality of junction projections 36 formed on the bottom surface of the body 31 similar to the connector wafer 30 illustrated in FIGS. 3 to 5. However, the connector wafer 30' does not include the two fixing protrusions 32 and 33 and is different from the connector wafer 30.

Figure 7:
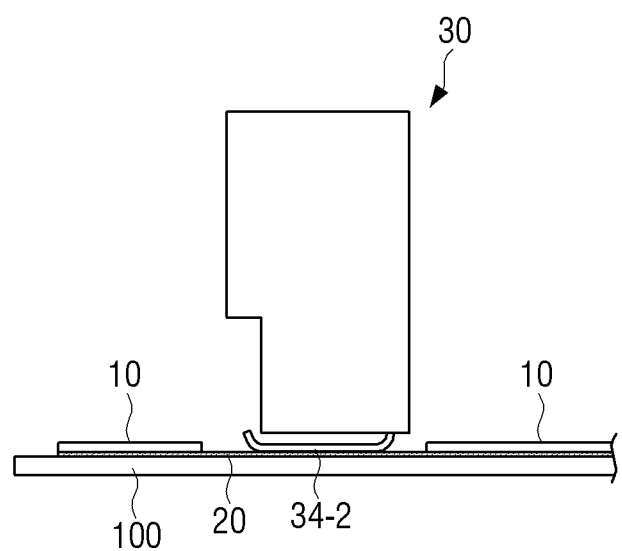
FIG. 7 is a view illustrating contact between a connecting pin of a connector and one of a plurality of band-shaped conductors of a hot stamping wiring according to an embodiment of the present disclosure.

FIG. 7 is a view illustrating contact between a connecting pin of a connector wafer and one of a plurality of band-shaped conductors of a hot stamping wiring according to an embodiment of the present disclosure.

When the connector wafer 30 is bonded to the insulating part 100 by the ultrasonic welding, as illustrated in FIG. 7, the contacting surfaces 34-2 of the connecting pins 34 of the connector wafer 30 may be in surface-to-surface contact with the plurality of band-shaped conductors 20 of the hot stamping wiring 1. Since the contacting surfaces 34-2 of the connecting pins 34 of the connector wafer 30 has the elasticity in a vertical direction, the connecting pins 34 and the band-shaped conductors 20 are in contact with each other with a certain pressure. Accordingly, the hot stamping wiring 1 and the connector wafer 30 according to an embodiment of the present disclosure may prevent contact failure from occurring between the band-shaped conductors 20 and the connecting pins 34.

As discussed above, the hot stamping wiring 1 according to an embodiment of the present disclosure may be attached on the top surface of a single insulating part 100. However, the hot stamping wiring 1 according to an embodiment of the present disclosure is not restricted to when the insulating part 100 is a single plane. The hot stamping wiring 1 according to an embodiment of the present disclosure may be used for electrical connection between loads provided in an insulating part having a bending portion or in two separated insulating parts. Such a hot stamping wiring is described in detail with reference to FIGS. 8 to 12.

Figure 8:
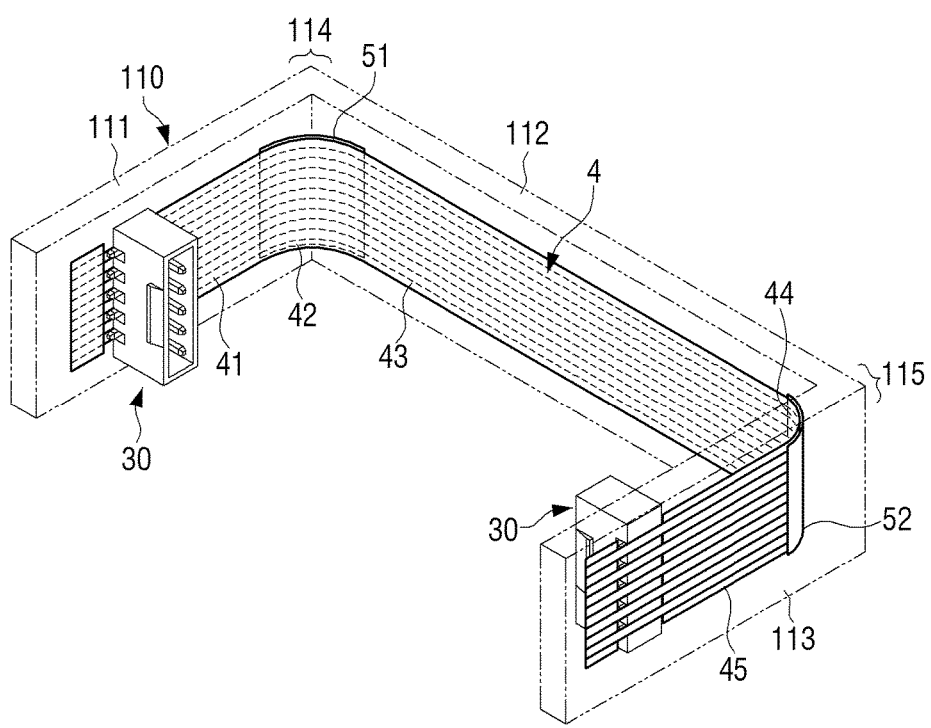
FIG. 8 is a perspective view illustrating a case in which a hot stamping wiring according to an embodiment of the present disclosure is provided on an insulating part having bending portions.

FIG. 8 is a perspective view illustrating a case in which a hot stamping wiring according to an embodiment of the present disclosure is provided on an insulating part having bending portions.

Referring to FIG. 8, the insulating part 110 is formed in a substantially U-shape, and is bent approximately 90 degrees at two points. In detail, the insulating part 110 includes three flat portions 111, 112, and 113 and two bent portions 114 and 115. The three flat portions 111, 112, and 113 include a first flat portion 111, a second flat portion 112, and a third flat portion 113 two adjacent flat portions of which are disposed about 90 degrees with respect to each other. The two bent portions 114 and 115 include a first bent portion 114 provided between the first flat portion 111 and the second flat portion 112, and a second bent portion 115 provided between the second flat portion 112 and the third flat portion 113.

A portion of one end of the hot stamping wiring 4, that is, a first portion 41 is attached to the first flat portion 111 by the hot stamping method, a middle portion of the hot stamping wiring 4, that is, a third portion 43 is attached to the second flat portion 112, and a portion of the other end of the hot stamping wiring 4, that is, a fifth portion 45 is attached to the third flat portion 113. A second portion 42 between the first portion 41 and the third portion 43 of the hot stamping wiring 4 is apart without being attached to the first bent portion 114 of the insulating part 110. A fourth portion 44 between the third portion 43 and the fifth portion 45 of the hot stamping wiring 4 is apart without being attached to the second bent portion 115 of the insulating part 110. The second and fourth portions 42 and 44 of the hot stamping wiring 4 that are not attached to the insulating part 110 are provided with insulation sheets 51 and 52 covering the plurality of exposed band-shaped conductors 20. Any material can be used as the insulation sheets 51 and 52 as long as the material can insulate the plurality of exposed band-shaped conductors 20. For example, the insulation sheets 51 and 52 may be formed of the same material as that of the hot stamping film.

The insulation sheets 51 and 52 may be attached to the hot stamping wiring 4 before the hot stamping wiring 4 is attached to the bent insulating part 110.

Figure 9:
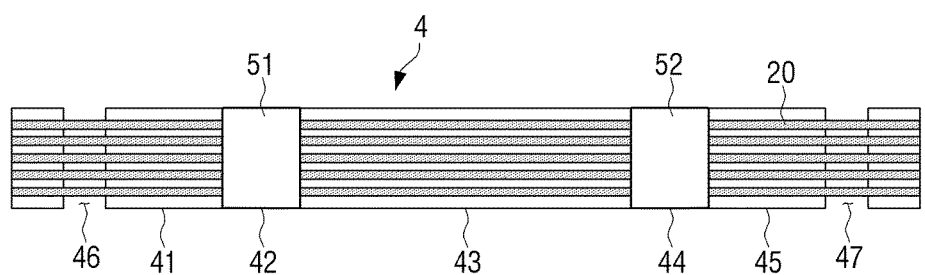
FIG. 9 is a view illustrating the hot stamping wiring provided on the insulating part of FIG. 8.

FIG. 9 is a view illustrating the hot stamping wiring provided on the insulating part of FIG. 8.

Referring to FIG. 9, before the hot stamping wiring 4 is attached to the insulating part 110, portions of the hot stamping film corresponding to portions 46 and 47 of the hot stamping wiring 4 on which two connector wafers 30 are disposed are removed so that portions of the plurality of band-shaped conductors 20 are exposed. The insulation sheets 51 and 52 are attached to the second portion 42 and the fourth portion 44 corresponding to the first bent portion 114 and the second bent portion 115 of the bent insulating part 110. Accordingly, since the second portion 42 and the fourth portion 44 of the hot stamping wiring 4, which are not attached to and are apart from the first and second bent portion 114 and 115, are provided with the insulation sheets 51 and 52, when the hot stamping wiring 4 as illustrated in FIG. 9 is attached to the insulating part 110, it may be prevented that a short circuit occurs between the plurality of band-shaped conductors 20.

Figure 10:
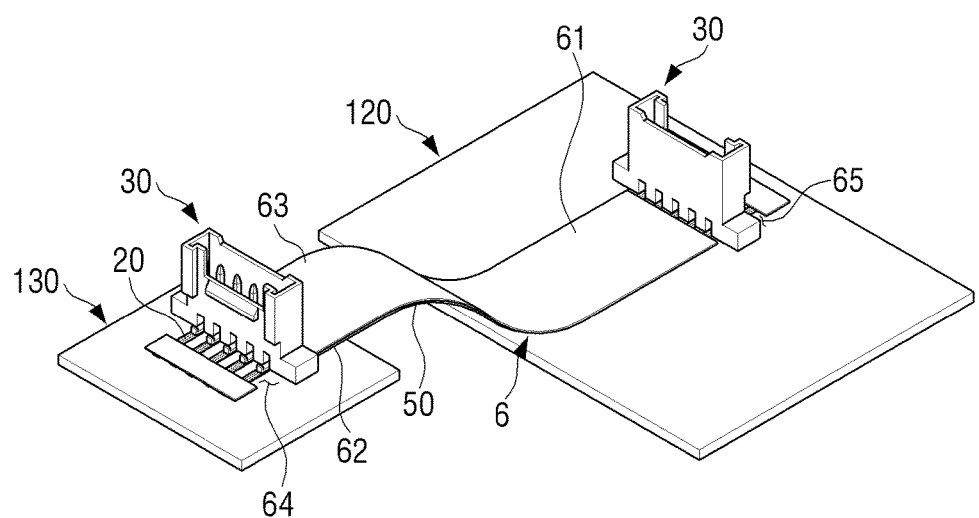
FIG. 10 is a perspective view illustrating a case in which a hot stamping wiring according to an embodiment of the present disclosure is provided on two insulating parts.

FIG. 10 is a perspective view illustrating a case in which a hot stamping wiring according to an embodiment of the present disclosure is provided on two insulating parts.

Referring to FIG. 10, a portion 61 of a hot stamping wiring 6 according to an embodiment of the present disclosure is attached to a first insulating part 120, and another portion 62 of the hot stamping wiring 6 is attached to a second insulating part 130 that is formed separately and apart from the first insulating part 120.

A first portion 61 of the hot stamping wiring 6 is attached to a surface of the first insulating part 120 by the hot stamping method, and a second portion 62 of the hot stamping wiring 6 is attached to a surface of the second insulating part 130 by the hot stamping method. A third portion 63 connecting the first portion 61 and the second portion 62 of the hot stamping wiring 6 is exposed to the air without being attached to the first and second insulating parts 120 and 130. Accordingly, in an embodiment as illustrated in FIG. 10, portions of the plurality of band-shaped conductors 20 of the hot stamping wiring 6 that are exposed to the air are covered by an insulation sheet 50, thereby preventing occurrence of short circuit. Before the hot stamping wiring 6 is attached to the first and second insulating parts 120 and 130, portions of hot stamping film corresponding to portions 64 and 65 of the hot stamping wiring 6 on which connector wafers 30 are disposed are removed, and the insulation sheet 50 is attached to the third portion 63.

The hot stamping wiring 6 is attached to the first insulating part 120 and the second insulating part 130 by the hot stamping method, and the first and second connector wafers 30 are attached to the first and second insulating parts 120 and 130 by the ultrasonic welding as described above.

In the above description, the connector wafer 30 may be fixed to the insulating parts 100, 110, 120, and 130. However, in accordance with a structure of electronic devices, the connector wafer may not be secured to the insulating part. In this case, the connector wafer may be directly secured to the hot stamping wiring.

A hot stamping wiring that is extended beyond an insulating part will be described with reference to FIGS. 11 and 12.

Figure 11:
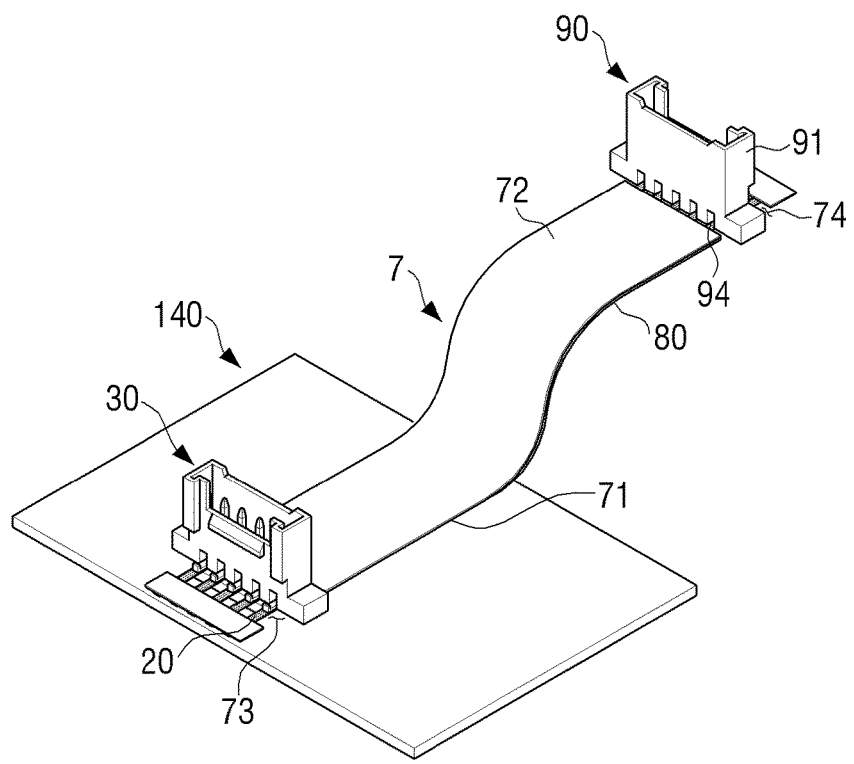
FIG. 11 is a perspective view illustrating a case in which a hot stamping wiring according to an embodiment of the present disclosure is extended beyond an insulating part.

FIG. 11 is a perspective view illustrating a case in which a hot stamping wiring according to an embodiment of the present disclosure is extended beyond an insulating part. FIG. 12 is a view illustrating a case in which a connector wafer is combined with the hot stamping wiring according to an embodiment of the present disclosure by heat fusion.

Referring to FIG. 11, a portion 71 of a hot stamping wiring 7 according to an embodiment of the present disclosure attached to a surface of an insulating part 140, and the other portion 72 of the hot stamping wiring 7 extended beyond the insulating part 140 and not attached to the insulating part 140.

A first portion 71 of the hot stamping wiring 7 is attached to a surface of the first insulating part 140 by the hot stamping method, and the second portion 72 of the hot stamping wiring 7 is not attached to the insulating part 140 and is extended to the space. The extended second portion 72 of the hot stamping wiring 7 is exposed to the air without being attached to the insulating part 140. Accordingly, in the embodiment as illustrated in FIG. 11, portions of the plurality of band-shaped conductors 20 of the hot stamping wiring 7 that are exposed to the air may be covered by an insulation sheet 80, thereby preventing short circuit from occurring. Before the hot stamping wiring 7 is attached to the insulating parts 140, portions of the hot stamping film corresponding to portions 73 and 74 of the hot stamping wiring 7 on which connector wafers 30 and 90 are disposed may be removed, and the insulation sheet 80 is attached to the second portion 72.

A first connector wafer 30, which is attached to the insulating part 140 by the ultrasonic welding, may be disposed in the first portion 71 of the hot stamping wiring 7 attached to the insulating part 140. The first connector wafer 30 is similar to the connector wafer for ultrasonic welding as the connector wafer 30 of the above-described embodiment.

A second connector wafer 90 may be fixed to the second portion 72 of the hot stamping wiring 7, which is not attached to the insulating part 140, by heat fusion.

The second connector wafer 90 may be formed to be fixed to the hot stamping wiring 7 by the heat fusion method. In other words, the second connector wafer 90 is a connector wafer for heat fusion.

The second connector wafer 90 that is a connector wafer for heat fusion includes a body 91, a plurality of connecting pins 94, and a plurality of junction projections 96 is the same as the connector wafer 30 for ultrasonic welding as described above. Accordingly, the connector wafer 90 for heat fusion and the connector wafer 30 for ultrasonic welding are similar to each other in the structure and shape. However, the connector wafer 90 for heat fusion may be different from the connector wafer 30 for ultrasonic welding in that a projecting length of each of a plurality of junction projections 96 of the connector wafer 90 for heat fusion may be formed so that when two adjacent junction projections of the plurality of junction projections 96 are melted, as illustrated in FIG. 12, the two adjacent junction projections 36 are connected to each other to cover one of the plurality of band-shaped conductors 20 therebetween. In other words, the length of the junction projections 96 for heat fusion provided in the connector wafer 90 for heat fusion may be longer than the length of the junction projections 36 for ultrasonic welding provided in the connector wafer 30 for ultrasonic welding.

Figure 12:
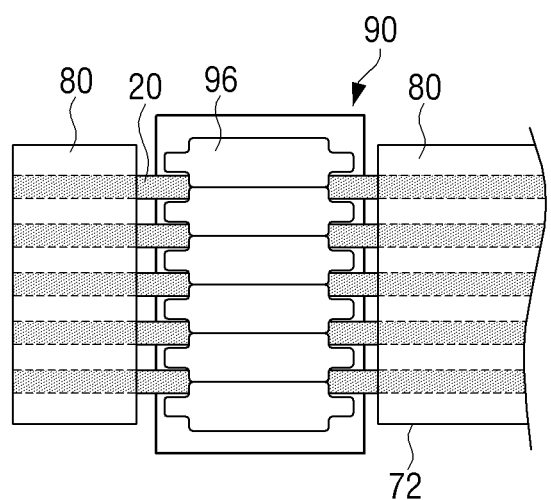
FIG. 12 is a view illustrating a state in which a connector wafer is attached to the hot stamping wiring of FIG. 11 by heat fusion.

As illustrated in FIG. 12, when the plurality of junction projections 36 of the second connector wafer 90 are melted so that the plurality of band-shaped conductors 20 of the hot stamping wiring 7 are covered by the plurality of melted junction projections 36, the second connector wafer 90 is fixed to the hot stamping wiring 7, thereby being not separated from the hot stamping wiring 7. Because a contacting surface of each of the plurality of connecting pins 94 of the second connector wafer 90 is in surface-to-surface contact with each of the plurality of band-shaped conductors 20 of the hot stamping wiring 7, contact resistance may be decreased and the contact may be improved.

Also, because when the second connector wafer 90 is fixed to the hot stamping wiring 7 by heat fusion, a higher temperature than that of the ultrasonic welding is needed, the second connector wafer 90 may be formed of a material that can withstand higher temperature than that of the ultrasonic welding. For example, when fixing the second connector wafer 90 to the hot stamping wiring 7 by the heat fusion, the plurality of junction projections 96 of the second connector wafer 90 may be heated for about 6-10 seconds in temperature of about 280☐ and pressure of about 4~8 bar.

Hereinafter, an electronic device to which a hot stamping wiring according to an embodiment of the present disclosure having the above-described structure is applied will be described.

In the below description, home appliances such as air conditioners which use a motor are described as an example of the electronic devices.

A case in which a motor used in an electronic device and a printed circuit board in which a controller for controlling the motor is formed are connected by a hot stamping wiring according to an embodiment of the present disclosure are described with reference to FIGS. 13 and 14.

Figure 13:
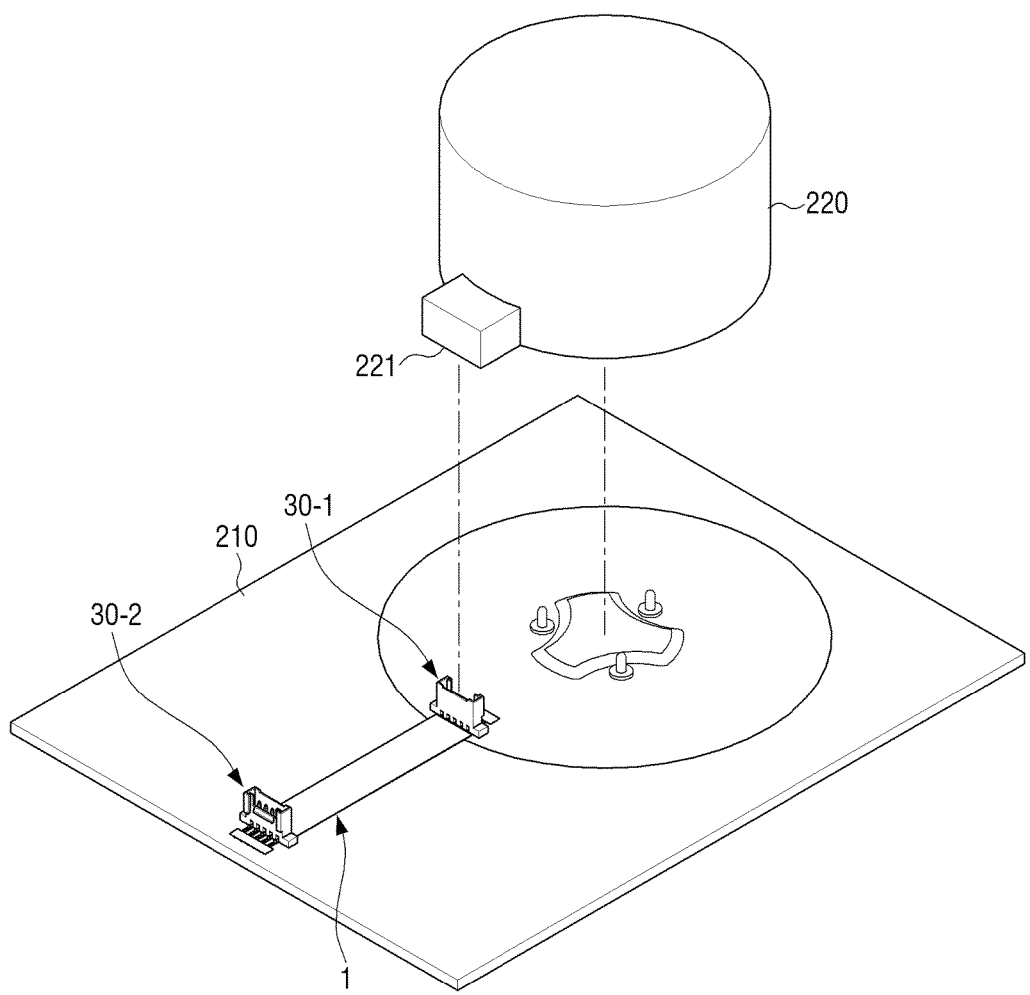
FIG. 13 is a view schematically illustrating an electronic device in which a hot stamping wiring according to an embodiment of the present disclosure is provided.
Figure 14:
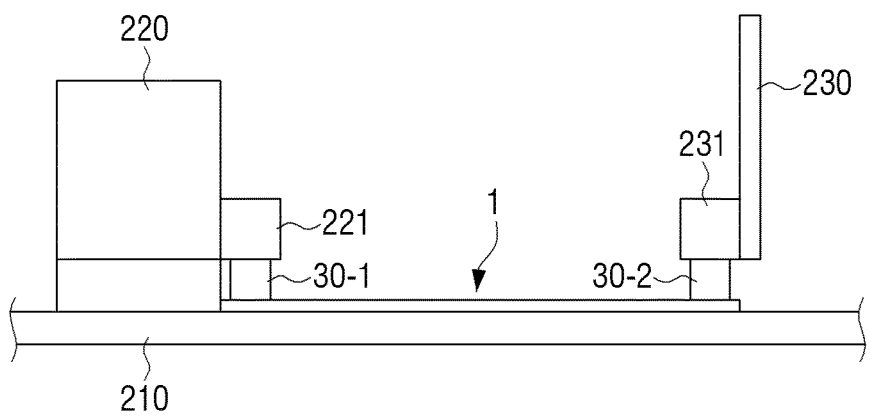
FIG. 14 is a view schematically illustrating a state in which a motor and a printed circuit board are connected to the hot stamping wiring of FIG. 13.

FIG. 13 is a perspective view schematically illustrating an electronic device in which a hot stamping wiring according to an embodiment of the present disclosure is provided, and FIG. 14 is a view schematically illustrating a state in which a motor and a printed circuit board are connected to the hot stamping wiring of FIG. 13.

As illustrated in FIG. 13, a hot stamping wiring 1 is attached to an inner component 210 of an electronic device 200. The inner component 210 of the electronic device 200 is disposed in the inside of the electronic device 200, is not exposed to the outside, and is formed of an insulating material. In general, since the inner component 210 of the electronic device 200 is produced by injecting a plastic having insulating properties, the inner component 210 can be used as an insulating part to which the hot stamping wiring 1 according to an embodiment of the present disclosure is attached by the hot stamping method. For example, the inner component 210 of the electronic device 200 may be produced by injecting plastic, such as acrylonitrile butadiene styrene (ABS), high impact polystyrene (HIPS), etc.

Two connector wafers 30-1 and 30-2 are attached to opposite ends of the hot stamping wiring 1 attached to the inner component 210 of the electronic device 200 by ultrasonic welding. At this time, the connecting pins 34 of the connector wafer 30 are in surface contact with the plurality of band-shaped conductors 20 of the hot stamping wiring 1 so that contact between the connecting pins 34 and the band-shaped conductors 20 is good.

A connector housing 221 of the motor 220 and a connector housing 231 of the printed circuit board 230 are coupled to the two connector wafers 30-1 and 30-2, respectively. Thus, the electrical connection between the motor 220 and the printed circuit board 230 of the electronic device 200 is implemented by the hot stamping wiring 1 according to an embodiment of the present disclosure.

It may be possible to automate the assembly of the hot stamping wiring 1, the motor 220, and the printed circuit board 230 with the inner component 210 of the electronic device 200.

For example, the inner component 210 of the electronic device 200 is secured to a work stand, and the hot stamping wiring 1 is fixed to the vacuum pads of an automatic machine. The hot stamping wiring 1 is moved in a direction perpendicular to the inner component 210 and is positioned on the upper surface of the inner component 210. The hot stamping wiring 1 positioned on the inner component 210 of the electronic device 200 may be pressed and heated by a pressure roller that is automatically moved, thereby being attached to the inner component 210. Accordingly, work of attaching the hot stamping wiring 1 to the inner component 210 of the electronic device 200 may be automated.

The work of fixing the connector wafers 30-1 and 30-2 to opposite ends of the hot stamping wiring 1 may be automated. For example, after the connector wafers 30-1 and 30-2 are moved in a direction perpendicular to the inner component 210 of the electronic device 200 and are positioned at the opposite ends of the hot stamping wiring 1 attached to the inner component 210 by using a jig, the connector wafers 30-1 and 30-2 are attached to the inner component 210 by ultrasonic welding. Accordingly, operation of attaching the connector wafers 30-1 and 30-2 to the inner component 210 may be also automated.

After aligning the connector housing 221 of the motor 220 with the first connector wafer 30-1 attached to the inner component 210 of the electronic device 200 by using a jig, the motor 220 is lowered so that the connector housing 221 of the motor 220 is coupled to the first connector wafer 30-1.

After aligning the connector housing 231 of the printed circuit board 230 with the second connector wafer 30-2 attached to the inner component 210 of the electronic device 200 by using a jig, the printed circuit board 230 is lowered so that the connector housing 231 of the printed circuit board 230 is coupled to the second connector wafer 30-2.

With a hot stamping wiring according to an embodiment of the present disclosure, it is possible to automate the work of electrically connecting a load and a printed circuit board or the work of electrically connecting two printed circuit boards. Therefore, the assembly time of the electronic device may be reduced.

With a hot stamping wiring according to an embodiment of the present disclosure, the plurality of connecting pins of the connector wafer are in surface-to-surface contact with the plurality of band-shaped conductors of the hot stamping wiring. Therefore, the connection reliability of the connector may be improved.

In the above description, the hot stamping wiring according to an embodiment of the present disclosure is applied to the electronic devices. However, the application of the present disclosure is not limited thereto. The hot stamping wiring according to an embodiment of the present disclosure may be applied to everywhere electrical connection between loads is required, such as smart clothes, etc.

Figure 15:
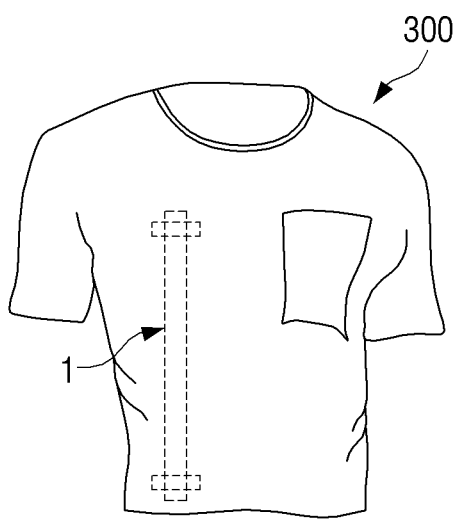
FIG. 15 is a view conceptually illustrating a clothes to which a hot stamping wiring according to an embodiment of the present disclosure is applied.

FIG. 15 is a view conceptually illustrating a clothes to which a hot stamping wiring according to an embodiment of the present disclosure is applied.

As illustrated in FIG. 15, a hot stamping wiring 1 according to an embodiment of the present disclosure is disposed in an inner surface of a clothes 300, and is used to electrically connect a sensor and a controller that are provided in the clothes 300.

Since the hot stamping wiring 1 according to an embodiment of the present disclosure includes a flexible hot stamping film and a plurality of flexible band-shaped conductors, the hot stamping wiring 1 can be freely deformed. Thus, in spite of disposing the hot stamping wiring 1 in the clothes 300, a user may not feel uncomfortable to wear the clothes 300, and washing of the clothes 300 is possible.

Hereinafter, a method for manufacturing a hot stamping wiring according to an embodiment of the present disclosure will be described with reference to FIG. 16.

FIG. 16 is a flowchart illustrating a method for manufacturing a hot stamping wiring according to an embodiment of the present disclosure.

A worker prepares an insulating part to which a hot stamping wiring will be attached. For example, the insulating part may be a plastic injecting part as inner components that are disposed in the inside of home appliances, such as air conditioners, refrigerators, washing machines, etc.

The worker prepares the hot stamping wiring and two connector wafers that will be attached to the insulating part (S1610). The hot stamping wiring is prepared so that portions of the hot stamping wiring at which the two connector wafers are disposed are cut for portions of a plurality of band-shaped conductors to be exposed. Further, a surface of the hot stamping wiring on which the plurality of band-shaped conductors are exposed is coated by adhesive. The adhesive may have no adhesive ability at ambient temperatures. The adhesive is melted at a predetermined temperature or more, thereby causing the plurality of band-shaped conductors and the hot stamping film to be attached to the insulating part.

The worker fixes the insulating part to a work stand using a fixing jig in order to prevent the insulating part from moving.

The hot stamping wiring may be positioned at a predetermined position of the upper surface of the insulating part (S1620). In a case of automated assembly line, the hot stamping wiring is moved and positioned at the predetermined position of the upper surface of the insulating part by using a moving jig.

The hot stamping wiring may be attached to the insulating part by hot stamping method (S1630). In detail, when heating the hot stamping wiring at a predetermined temperature and applying a predetermined pressure to the hot stamping wiring, the adhesive coated on the hot stamping wiring may be melted so that the hot stamping wiring is attached to the insulating part.

For example, the hot stamping wiring may be attached to the insulating part by moving a roller in the inside of which a heater is provided while pressing down the roller at a predetermined pressure. In a case of automated assembly line, the hot stamping wiring may be automatically heated to the predetermined temperature, and the roller that presses the hot stamping wiring at the predetermined pressure is automatically moved.

A connector wafer may be attached to the cut portion of the hot stamping wiring by ultrasonic welding (S1640).

After causing the plurality of junction projections of the connector wafer to be in contact with the upper surface of the insulating part, ultrasonic vibration may be applied to the connector wafer while applying a predetermined pressure to the connector wafer so that the plurality of junction projections is attached to the upper surface of the insulating part. Two connector wafers may be at the same time attached to the insulating part by ultrasonic welding. In the case of automated assembly line, the connector wafer is automatically moved to the attaching position, and is automatically attached to the insulating part by ultrasonic welding.

Connector housings that are provided in loads, for example, a motor and a printed circuit board may be coupled to the two connector wafers. In a case of automated assembly line, the connector housings provided in the loads are automatically coupled to the connector wafers attached to the insulating part.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A hot stamping wiring comprising:
   a hot stamping film that has insulation properties and attachable to an insulating part by a hot stamping;
   a plurality of band-shaped conductors attachable to a surface of the hot stamping film in a lengthwise direction of the hot stamping film, and spaced apart at intervals; and
   a connector wafer, which includes a plurality of connecting pins corresponding to the plurality of band-shaped conductors, disposed at the hot stamping film, and attachable to the insulating part by ultrasonic welding,
   wherein the connector wafer comprises a plurality of junction projections weldable by ultrasonic welding.

2. The hot stamping wiring of claim 1, wherein
   an end portion of each of the plurality of connecting pins is formed in a contacting surface that is exposed on a surface of the connector wafer.

3. The hot stamping wiring of claim 2, wherein
   the plurality of junction projections are formed between contacting surfaces of the plurality of connecting pins.

4. The hot stamping wiring of claim 3, wherein
   the plurality of junction projections project further than the contacting surfaces of the plurality of connecting pins.

5. The hot stamping wiring of claim 2, wherein
   the plurality of band-shaped conductors and the contacting surfaces of the plurality of connecting pins are in surface-to-surface contact with each other.

6. The hot stamping wiring of claim 1, wherein
   an insulation sheet to cover the plurality of band-shaped conductors is attached to at least one portion of the hot stamping film.

7. The hot stamping wiring of claim 6, further comprising:
   a connector wafer including a plurality of connecting pins corresponding to the plurality of band-shaped conductors and attachable to the portion of the hot stamping wiring, to which the insulation sheet is attached, by heat fusion,
   wherein the connector wafer comprises a plurality of junction projections attachable by heat fusion.

8. The hot stamping wiring of claim 7, wherein
   the plurality of connecting pins and the plurality of band-shaped conductors are in surface-to-surface contact with each other.

9. The hot stamping wiring of claim 1, wherein
   the hot stamping film is formed of a flexible material.

10. The hot stamping wiring of claim 1, wherein
    the insulating part and the connector wafer are formed of a same material.

11. The hot stamping wiring of claim 1, wherein
    the insulating part comprises an inner component that is disposed in an inside of an electronic device.

12. The hot stamping wiring of claim 1, wherein
    the insulating part comprises an inner surface of a clothes.

13. An electronic device having a hot stamping wiring, the electronic device comprising:
    a case comprising an inner component with insulation properties;
    at least one load disposed inside the case;
    at least one printed circuit board disposed inside the case and configured to control the at least one load; and
    a hot stamping wiring configured to connect the at least one load and the at least one printed circuit board,
    wherein the hot stamping wiring comprises,
       a hot stamping film that has insulation properties and attachable to the inner component having insulation properties by a hot stamping,
       a plurality of band-shaped conductors attachable to a surface of the hot stamping film in a lengthwise direction of the hot stamping film, and spaced apart at intervals, and
       first and second connector wafers including a plurality of connecting pins corresponding to the plurality of band-shaped conductors, disposed at two portions of the hot stamping film, and attachable to the inner component by ultrasonic welding,
    wherein the first and second connector wafers include a plurality of junction projections weldable by ultrasonic welding, the at least one load couplable to the first connector wafer, and the at least one printed circuit board couplable to the second connector wafer.

14. The electronic device having a hot stamping wiring of claim 13, wherein
    the inner component with the insulation properties includes a first inner component and a second inner component that are formed separately,
    the first connector wafer is disposed in the first inner component,
    the second connector wafer is disposed in the second inner component,
    the hot stamping wiring connects the first inner component and the second inner component, and
    an insulation sheet to cover the plurality of band-shaped conductors is attachable to a portion of the hot stamping wiring that is not attached to the first inner component and the second inner component.

15. The electronic device having a hot stamping wiring of claim 13, wherein
    an end portion of each of the plurality of connecting pins is formed in a contacting surface that is exposed on a surface of each of the first and second connector wafers, and
    the plurality of junction projections are formed between contacting surfaces of the plurality of connecting pins.

16. The electronic device having a hot stamping wiring of claim 15, wherein
    the plurality of band-shaped conductors and the contacting surfaces of the plurality of connecting pins are in surface-to-surface contact with each other.

17. The electronic device having a hot stamping wiring of claim 15, wherein the plurality of junction projections project further than the contacting surfaces of the plurality of connecting pins.

18. A method for manufacturing a hot stamping wiring, the method comprising:
preparing a hot stamping wiring;
positioning the hot stamping wiring on a surface of an insulating part;
attaching the hot stamping wiring to the insulating part by a hot stamping; and
attaching at least one connector wafer to the hot stamping wiring by ultrasonic welding.

19. The method of claim 18, wherein
the hot stamping wiring comprises,
a hot stamping film that has insulation properties and attachable to the insulating part by the hot stamping, and
a plurality of band-shaped conductors attachable to a surface of the hot stamping film in a lengthwise direction of the hot stamping film, and spaced apart at intervals,
wherein the connector wafer comprises a plurality of junction projections weldable by ultrasonic welding.

20. The method of claim 19, further comprising:
removing a portion of the hot stamping film to attach the at least one connector wafer.

* * * * *